(12) United States Patent
Woersinger et al.

(10) Patent No.: US 8,069,739 B2
(45) Date of Patent: Dec. 6, 2011

(54) BASE DESIGN FOR SELF-CENTERING

(75) Inventors: Juergen Woersinger, Maulbronn (DE); Martin Mast, Gerlingen (DE); Andreas Stratmann, Gomaringen (DE); Richard Muehlheim, Tuebingen (DE); Regina Grote, Reutlingen (DE); Hans-Juergen Spiegel, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/612,393

(22) Filed: Nov. 4, 2009

(65) Prior Publication Data

US 2010/0107786 A1 May 6, 2010

Related U.S. Application Data

(63) Continuation of application No. 10/558,570, filed as application No. PCT/DE2004/000822 on Apr. 20, 2004, now Pat. No. 7,637,176.

(30) Foreign Application Priority Data

May 28, 2003 (DE) .................................. 103 24 220

(51) Int. Cl.
*G01D 21/00* (2006.01)

(52) U.S. Cl. ....................................................... 73/866.5
(58) Field of Classification Search .................. None
See application file for complete search history.

(56) References Cited

U.S. PATENT DOCUMENTS

| 1,228,357 | A | * | 5/1917 | Domoto | ........................ | 220/611 |
| 4,131,088 | A |   | 12/1978 | Reddy |   |   |
| 4,198,990 | A | * | 4/1980 | Higgins et al. | ................ | 600/595 |
| 4,285,003 | A |   | 8/1981 | Gaicki |   |   |
| 5,209,120 | A |   | 5/1993 | Araki |   |   |
| 5,948,992 | A |   | 9/1999 | Yamamoto |   |   |
| 6,255,942 | B1 | * | 7/2001 | Knudsen | ........................ | 340/506 |

FOREIGN PATENT DOCUMENTS

DE  199 19 112  11/2000

* cited by examiner

*Primary Examiner* — Robert Raevis
(74) *Attorney, Agent, or Firm* — Kenyon & Kenyon LLP

(57) ABSTRACT

A device having at least one housing and one bottom connected to the housing. In this context, the housing has a housing wall and the bottom at least one base. Further it is provided for the base to have a specifiable edge. The essence of the present arrangement now lies in the fact that the edge of the base has at least two regions, a first region being situated closer to the housing wall and a second region being further removed from the housing wall.

16 Claims, 2 Drawing Sheets

BASE DESIGN FOR SELF-CENTERING

CROSS-REFERENCE TO RELATED APPLICATION

This application is a continuation of U.S. patent application Ser. No. 10/558,570 which was filed on Sep. 6, 2006 now U.S. Pat. No. 7,637,176, which in turn is a National Phase Application based on International Application PCT/DE2004/000822 filed on Apr. 20, 2004, and which claims priority to German Patent Application No. DE 10324220.1 filed May 28, 2003, the contents of all of which are incorporated herein by reference in their entirety.

FIELD OF THE INVENTION

The present invention starts out from a device and a method for manufacturing the device in which at least one housing and one bottom connected to the housing are designed in such a way that the housing has a housing wall and the housing bottom has at least one base.

BACKGROUND INFORMATION

The edge of the base is designed in such away that it has at least two regions, a first region being situated closer to the housing wall and the second region being further removed from the housing wall. A device in which a pressure sensor having a base is situated in a pressure sensor housing is already known from the patent document German Published Patent Application No. 199 19 112.

SUMMARY OF THE INVENTION

The present invention starts out from a micromechanical device having at least one housing and one floor connected to the housing. In this instance, the housing has a housing wall and the bottom at least one base. Further it is provided for the base to have a specifiably designed edge. The essence of the present invention now lies in the fact that the edge of the base has at least two regions, a first region of the edge being situated closer to the housing wall and a second region of the edge being further removed from the housing wall.

It is especially advantageous if the edge of the base alternately is made up of the first and the second region. In this instance it is provided in particular for the base to have in each instance eight first and second regions. A further refinement of the present invention provides for the regions to be arranged for example symmetrically distributed over the edge with respect to the center of the base.

According to the present invention, a first region is made up of a ridge, an angle, a corner or a point on the edge of the base. By contrast, the second region represents a flat surface or a rounded surface with respect to the housing wall on the edge of the base.

A preferred refinement of the present invention provides for the contact between the housing wall and the base to occur only in one region. This may be achieved, for example, in that only the first region has a contact. Furthermore it is possible that not every first region on the base has a contact to the housing wall. Moreover, it may be provided for the base to be designed as a centering base, which can allow for a centering of the housing on the housing bottom. Apart from an electrical contact between the housing wall and the base, a thermal contact may also be considered.

The development of the base on the housing bottom advantageously provides for a gap between the base and the housing wall at least in the second region. In a special refinement of the present invention, a filling material is provided in this gap, which completely fills the gap. In addition there is a provision for the gap between the edge of the base and the housing wall to be filled at least partially with the filling material. Furthermore it is provided for a passivating substance to be used as filling material.

It is particularly advantageous if the first and the second region of the edge of the base are designed in such a way that a filling of the gap designed as a filling region between the edge of the base and the housing wall is achieved with a minimum of inclusions of air and/or hollow spaces in the filling material. For this purpose, the design of the first and second region of the edge of the base may be varied beyond the dimensions of the two regions. Another possibility for minimizing the inclusions is to coordinate the succession of the first and the second region appropriately.

The present invention provides for the filling material between the edge of the base and the housing wall to be entered at least up to the height of the base. Moreover there may be a provision for parts of the upper side of the base to be covered by the filling material as well. This may be advantageous for example for fixing the contacts of a sensor element.

In a further development of the present invention, the bottom has at least one sensor element, which detects an operating variable representing at least one operating parameter of a medium adjoining the sensor element and/or a state parameter of the sensor element. For this purpose, it is particularly provided for the sensor element to be located in the region of the base. If operating parameters of a medium are detected, then there is a provision for the sensor element to be exposed to the medium. Thus a pressure and/or a pressure difference and/or a temperature and/or a density and/or a flow velocity of the medium may be detected. If a state variable of the sensor element is to be detected, then a direct contact with a medium surrounding the sensor element is not necessary. State variables such as, for example, a velocity and/or an acceleration and/or a rotation can thus be detected directly by the sensor element.

DETAILED DESCRIPTION

Figure 1:
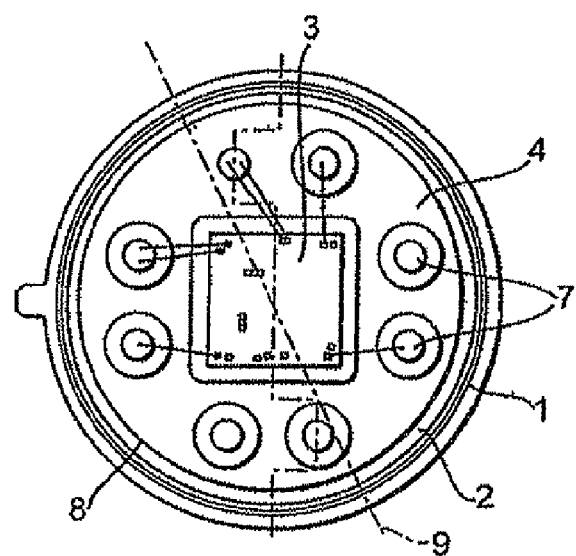
FIG. 1 shows the top view of a conventional base of a housing form for receiving a micromechanical component.

With reference to the drawings, an exemplary embodiment will be described in the following in which the advantages of the design of the base of a housing form according to the present invention are shown. Typically such housing forms are used as housings for sensors. FIG. 1 shows the top view of a conventional base 4 situated on a housing bottom 2. In this instance, sensor element 3 is situated centrally in base 4. Sensor element 3 is contacted via pins 7 through base 4. Housing cover 1 is centered circumferentially on base edge 8.

Figure 2:
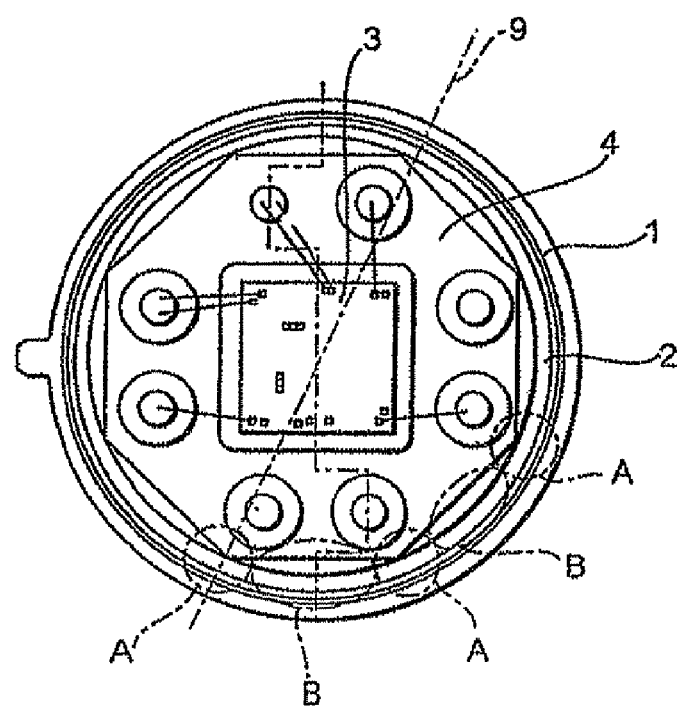
FIG. 2 shows the top view of a base modified in accordance with the present invention.
Figure 3:
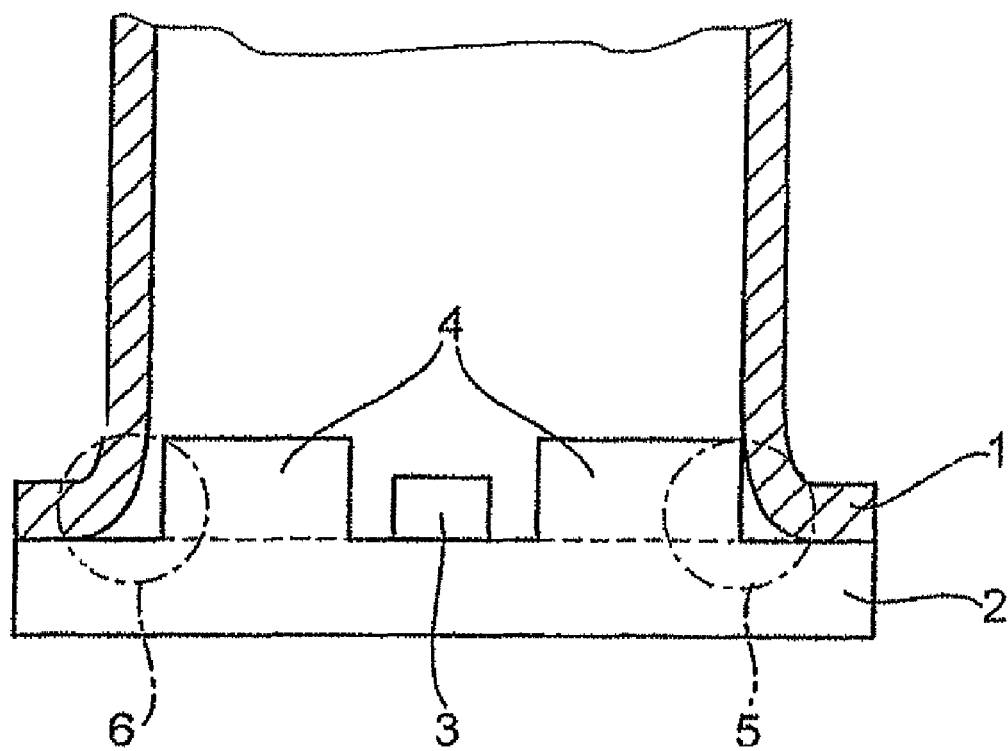
FIG. 3 shows a cross section through the housing depicting the bottom connected to the housing and the base.

A cross section 9 through housing cover 1, housing bottom 2 and base 4 is shown in FIG. 3. Here one can see that housing cover 1 is connected to housing bottom 2. Housing cover 1 is centered on housing bottom 2 via the guide of the housing wall on base 4 of housing bottom 2. Due to tolerances in the manufacturing of housing cover 1 and of base 4, the clearance between the housing wall and base 4 across the entire length of the edge of the base may be of uneven width. It is not necessary, however, as shown in FIG. 1 that the housing wall contacts base 4 across the entire edge of the base. According to the present invention, only a few contact points are required between base 8 and the housing wall, as shown in FIG. 2 in the example of an octagonal base 4, in order to achieve centering.

In a special specific embodiment of the present invention according to FIG. 2, the edge of base 4 is designed in such a way that first regions A are closer to the housing wall and second regions B are further removed from the housing wall. In FIG. 2, first regions A are designed as corners in base 4, while a different design of first regions A is also conceivable. Housing cover 1 in this instance is centered via selected contact points in first regions A. In comparison to FIG. 1, FIG. 2 clearly shows that defined free volumes between the housing wall and base 4 are created between the contact point in first regions A. These free volumes facilitate filling the gap between the edge and the housing wall with filling material.

As cross section 9 in FIG. 3 additionally shows, the connection of the housing cover and the housing bottom creates pockets 5 and 6 between the housing wall and base 4 or housing bottom 2. If, for example, for stabilizing the connection between housing cover 1 and housing bottom 2, a filling material is introduced, then in the formation of these pockets 5 and 6 in an embodiment of base 4 according to FIG. 1 it is impossible to avoid inclusions of air and/or hollow spaces. If base 4 is designed according to the present invention as shown in FIG. 2, however, then the filling material, which is introduced for example from above between the housing wall and base 4 or housing bottom 2, will also reach these places in that pockets 5, which would otherwise not be accessible from above, are filled from the side.

Suitable sensor types, in which the design of the base (4) according to the present invention may be applied, are pressure sensors, thermal sensors, mass flow sensors, but also acceleration sensors, yaw rate sensors or rotational speed sensors. Since depending on the sensor type there must be a direct contact between the sensor element (3) and the medium surrounding the sensor, a corresponding opening may be provided in housing cover 1.

What is claimed is:
1. A device, comprising:
a housing having a housing wall;
a bottom connected to the housing and having at least one base, the base having an edge,
wherein:
the device is manufactured to provide the edge of the base with a plurality of first predetermined regions and a plurality of second predetermined regions, a distance of each of the first regions from the housing wall being substantially less than a greatest distance of each of the second regions from the housing wall within a single plane that is perpendicular to a central axis, the central axis extending between a top and a bottom of the housing and into the base;
a height of the housing wall between the top and the bottom of the housing is substantially greater than a height of the base;
the first regions of the base center the housing on the base by contacting the housing wall;
free volumes disposed between locations of contact between the first regions and the housing wall are filled with a passivating material; and
the device is a micromechanical sensor.

2. The device as recited in claim 1, wherein:
the one or more first regions include eight first regions and the one or more second regions include eight second regions;
the edge of the base is made up alternately of the first regions and the second regions; and
the first regions and the second regions are arranged symmetrically with respect to a center of the base on the edge of the base.

3. The device as recited in claim 1, wherein:
the edge is a surface that extends, in a direction perpendicular to the central axis, to surround the central axis; and
each of the one or more first regions includes one of a ridge, an angle, a corner, and a point formed by a meeting of respective extensions extending from two sections of a respective one of the one or more second regions of the surface, the two sections of the surface being one of flat and rounded.

4. The device as recited in claim 1, wherein a direct contact exists between the housing wall and the base only in at least the first regions.

5. The device as recited in claim 1, wherein:
the edge is a surface that extends, in a direction perpendicular to the central axis and in planes parallel to the central axis, to surround the central axis; and
the passivating material fills all space between the edge and the housing wall that existed prior to introduction of the passivating material.

6. The device as recited in claim 1, wherein:
the passivating material covers the base at least partially, such that the passivating material covers the edge and a part of an upper side of the base.

7. The device as recited in claim 1, wherein:
the bottom includes a sensor element that detects an operating variable representing at least one of:
an operating parameter of a medium adjoining the sensor element; and
a state parameter of the sensor element;
the operating parameter includes at least one of a pressure, a pressure difference, a temperature, a density, and a flow velocity; and
the state parameter includes at least one of a velocity, an acceleration, a rotation, and a yawing motion.

8. The device as recited in claim 7, further comprising:
pins that contact the sensor element through the base.

9. The device as recited in claim 7, wherein the state parameter includes at least one of the velocity, the acceleration, and the yawing motion.

10. The device as recited in claim 1, wherein the manufacturing of the edge of the base with the one or more first and one or more second predetermined regions provides the edge with a shape usable for centering the housing on the bottom.

11. The device as recited in claim 1, wherein the bottom includes a portion that extends radially outward beyond the edge.

12. A device, comprising:
a housing having a housing wall;
a bottom connected to the housing and having at least one base, the base having an edge;
wherein:
the device is manufactured to provide the edge of the base with a plurality of first predetermined regions and a plurality of second predetermined regions, each of the first regions being substantially closer to the housing wall than each of the second regions within a single plane that is perpendicular to a central axis, the central axis extending between a top and a bottom of the housing and into the base;

the bottom includes a sensor element that detects and outputs an operating variable representing at least one of:
an operating parameter of a medium adjoining the sensor element; and
a state parameter of the sensor element;

the operating parameter includes at least one of a pressure, a pressure difference, a temperature, a density, and a flow velocity;

the state parameter includes at least one of a velocity, an acceleration, a rotation, and a yawing motion;

the first regions of the base center the housing on the base by contacting the housing wall;

free volumes disposed between locations of contact between the first regions and the housing wall are filled with a passivating material; and the device is a micromechanical sensor.

13. The device as recited in claim 12, wherein the state parameter includes at least one of the velocity, the acceleration, and the yawing motion.

14. A method for manufacturing a device, comprising:
providing a housing having a housing wall;
providing a bottom connected to the housing and having at least one base, the base having an edge, wherein:
the providing of the bottom is performed in a manner that results in formation of the edge with a plurality of first predetermined regions and a plurality of second predetermined regions, a distance of each of the first regions from the housing wall being substantially less than a greatest distance of each of the second regions from the housing wall within a single plane that is perpendicular to a central axis, the central axis extending between a top and a bottom of the housing and into the base;

a height of the housing wall between the top and the bottom of the housing is substantially greater than a height of the base;

the first regions of the base center the housing on the base by contacting the housing wall;

free volumes disposed between locations of contact between the first regions and the housing wall are filled with a passivating material; and the device is a micromechanical sensor.

15. The method as recited in claim 14, wherein the passivating material minimizes inclusions of at least one of air and hollow spaces in the free volumes.

16. The method as recited in claim 14, wherein the formation of the edge with one or more first and one or more second predetermined regions provides the edge with a predetermined shape, the method further comprising:
using the shape to center the housing on the bottom.

* * * * *